United States Patent
Liang et al.

(10) Patent No.: US 9,748,212 B2
(45) Date of Patent: Aug. 29, 2017

(54) SHADOW PAD FOR POST-PASSIVATION INTERCONNECT STRUCTURES

(71) Applicant: Taiwan Semiconductor Manufacturing Company, Ltd., Hsin-Chu (TW)

(72) Inventors: Shih-Wei Liang, Dajia Township (TW); Bor-Rung Su, New Taipei (TW); Chang-Pin Huang, Yangmei Township (TW); Chien-Chia Chiu, Zhongli (TW); Hsien-Ming Tu, Zhubei (TW); Chun-Hung Lin, Taipei (TW); Yu-Chia Lai, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/701,274

(22) Filed: Apr. 30, 2015

(65) Prior Publication Data

US 2016/0322337 A1 Nov. 3, 2016

(51) Int. Cl.
*H01L 21/31* (2006.01)
*H01L 25/10* (2006.01)
*H01L 25/00* (2006.01)
*H01L 23/00* (2006.01)

(52) U.S. Cl.
CPC ............ *H01L 25/105* (2013.01); *H01L 24/19* (2013.01); *H01L 24/20* (2013.01); *H01L 25/50* (2013.01); H01L 2224/04042 (2013.01); H01L 2224/04105 (2013.01); H01L 2224/12105 (2013.01); H01L 2224/32145 (2013.01); H01L 2224/32225 (2013.01); H01L 2224/48091 (2013.01); H01L 2224/48227 (2013.01); H01L 2224/73265 (2013.01); H01L 2225/0651 (2013.01); H01L 2225/06568 (2013.01); H01L 2225/1035 (2013.01); H01L 2225/1041 (2013.01); H01L 2225/1058 (2013.01)

(58) Field of Classification Search
CPC .............................. H01L 25/105; H01L 25/50
USPC ......... 257/737, 738, 773, 774, 778, 780, 786
See application file for complete search history.

(56) References Cited

U.S. PATENT DOCUMENTS

| | | | |
|---|---|---|---|
| 7,564,115 | B2 | 7/2009 | Chen et al. |
| 7,633,165 | B2 | 12/2009 | Hsu et al. |
| 7,825,024 | B2 | 11/2010 | Lin et al. |
| 7,973,413 | B2 | 7/2011 | Kuo et al. |
| 8,105,875 | B1 | 1/2012 | Hu et al. |
| 8,158,456 | B2 | 4/2012 | Chen et al. |
| 8,183,578 | B2 | 5/2012 | Wang |

(Continued)

*Primary Examiner* — Hung Vu
(74) *Attorney, Agent, or Firm* — Slater Matsil, LLP

(57) ABSTRACT

Interconnect structures, packaged semiconductor devices, and methods of packaging semiconductor devices are disclosed. In some embodiments, an interconnect structure includes a first post-passivation interconnect (PPI) layer. The first PPI layer includes a landing pad and a shadow pad material proximate the landing pad. A polymer layer is over the first PPI layer, and a second PPI layer is over the polymer layer. The second PPI layer includes a PPI pad. The PPI pad is coupled to the landing pad by a via in the polymer layer. The shadow pad material is proximate the PPI pad and comprises a greater dimension than a dimension of the PPI pad. The shadow pad material is disposed laterally around the PPI pad.

20 Claims, 12 Drawing Sheets

(56) References Cited

U.S. PATENT DOCUMENTS

| | | |
|---|---|---|
| 8,183,579 B2 | 5/2012 | Wang |
| 8,227,902 B2 | 7/2012 | Kuo |
| 8,278,152 B2 | 10/2012 | Liu et al. |
| 8,361,842 B2 | 1/2013 | Yu et al. |
| 8,426,961 B2 | 4/2013 | Shih et al. |
| 8,462,511 B2 * | 6/2013 | Lee .................. H01L 23/3677 257/686 |
| 8,669,174 B2 | 3/2014 | Wu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,802,504 B1 | 8/2014 | Hou et al. |
| 8,803,292 B2 | 8/2014 | Chen et al. |
| 8,803,306 B1 | 8/2014 | Yu et al. |
| 8,803,316 B2 | 8/2014 | Lin et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0093077 A1 * | 4/2013 | Liang .................. H01L 23/3192 257/737 |
| 2013/0140706 A1 * | 6/2013 | Yu .......................... H01L 24/11 257/773 |
| 2013/0168848 A1 | 7/2013 | Lin et al. |
| 2013/0307140 A1 | 11/2013 | Huang et al. |
| 2014/0001645 A1 | 1/2014 | Lin et al. |
| 2014/0203429 A1 | 7/2014 | Yu et al. |
| 2014/0225222 A1 | 8/2014 | Yu et al. |
| 2014/0225258 A1 | 8/2014 | Chiu et al. |
| 2014/0252572 A1 | 9/2014 | Hou et al. |
| 2014/0252646 A1 | 9/2014 | Hung et al. |
| 2014/0264930 A1 | 9/2014 | Yu et al. |

* cited by examiner

SHADOW PAD FOR POST-PASSIVATION INTERCONNECT STRUCTURES

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package so that electrical contacts may be made on a larger pitch than contact pads of the integrated circuit. WLPs are often used to package integrated circuits (ICs) demanding high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
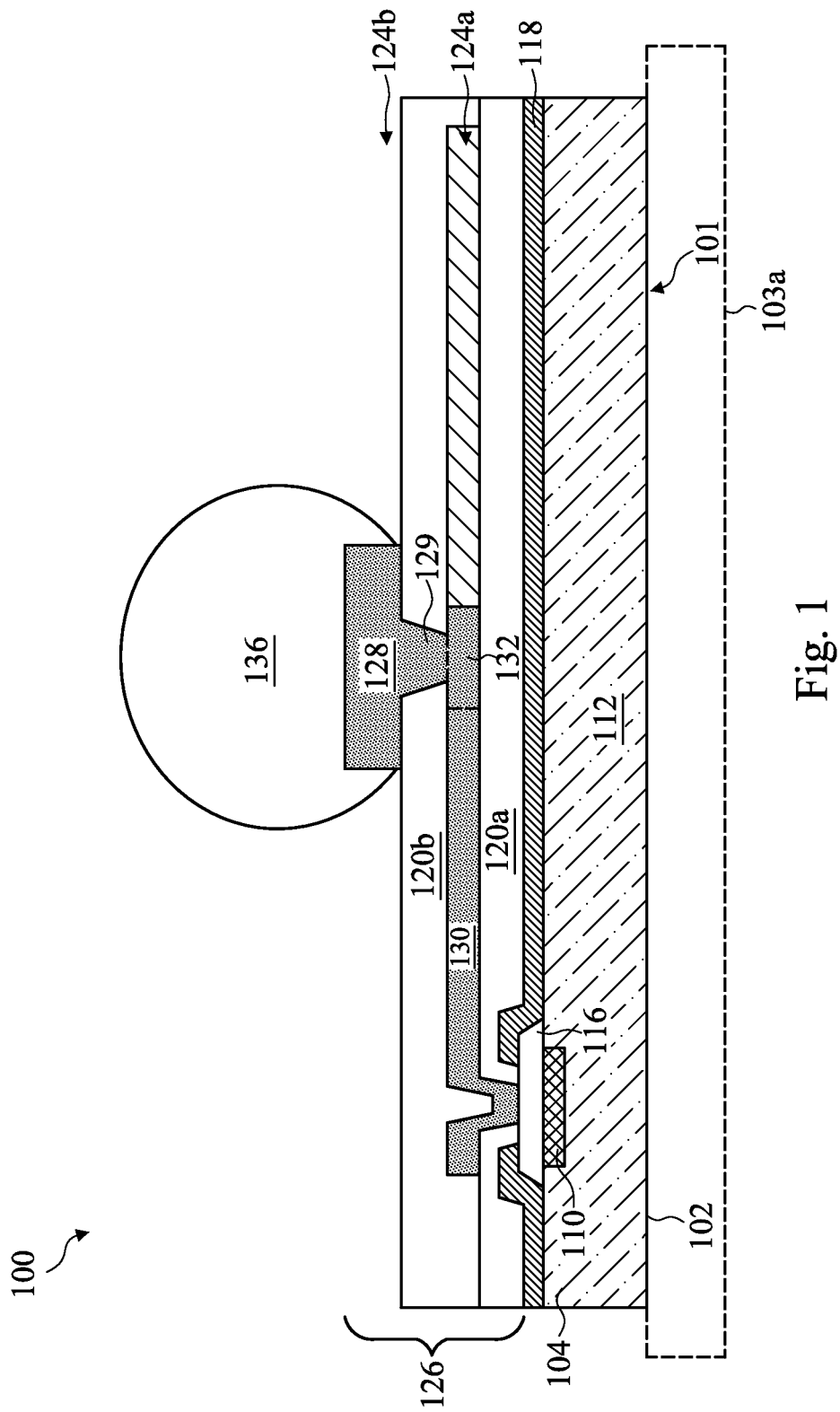
FIG. 1 illustrates a cross-sectional view of a design for an interconnect structure of a packaged semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures, packaged semiconductor devices, and methods of packaging semiconductor devices are disclosed in the present disclosure. Packaging devices will be described herein that include a shadow pad material disposed proximate landing pads and beneath and proximate post-passivation interconnect (PPI) pads of an interconnect structure. The shadow pad material may lower stress of the interconnect structure, improve signal design flexibility, improve chip-package interaction (CPI) windows, and also provide other advantages. Some embodiments will be disclosed that include a shadow pad material beneath and proximate a PPI pad and coupled to a landing pad which is implementable in interconnect structures and packages for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board or packaging substrate types of packaging, or the like. Throughout the various views and illustrative embodiments, like reference numerals are used to designate like elements.

Figure 2:
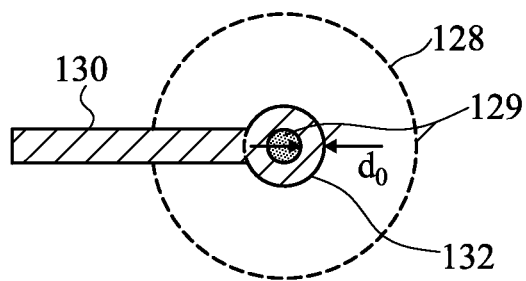
FIG. 2 shows a top view of a post-passivation interconnect (PPI) pad, landing pad, and PPI line of the design of the interconnect structure shown in FIG. 1 in accordance with some embodiments.

Referring first to FIG. 1, a cross-sectional view of a design for an interconnect structure 126 of a portion 100 of a packaged semiconductor device in accordance with some embodiments of the present disclosure is shown. FIG. 2 illustrates a top view of a post-passivation interconnect (PPI) pad 118, landing pad 132, and PPI line 130 of the design of the interconnect structure shown in FIG. 1 in accordance with some embodiments.

The portion 100 of the packaged semiconductor device includes an integrated circuit die 101 that is coupled to a carrier 103a (shown in phantom, e.g., in dashed lines, in FIG. 1) for a packaging process in some embodiments. The integrated circuit die 101 includes a substrate 102 that includes circuitry 112 and has an insulating material 104 formed thereon. Contact pads 110 are formed within or over the insulating material 104, and contact pads 116 are coupled to the contact pads 110 in some embodiments. A passivation layer 118 is disposed over the substrate 102 and portions of the contact pads 116. A first polymer layer 120a is formed over the passivation layer 118, and a first PPI layer 124a is formed over the first polymer layer 120a. The first PPI layer 124a includes a PPI line 130 coupled to a landing pad 132. The PPI line 130 includes a via portion that extends into an opening in the first polymer layer 120a and the passivation layer 118 to make electrical contact with contact pad 116. A second polymer layer 120b is formed over the PPI line 130, portions of the landing pad 132, and portions of the first polymer layer 120a. A second PPI layer 124b is formed over the second polymer layer 120b. The second PPI layer 124b includes a PPI pad 128 formed over the second polymer layer 120b. The PPI pad 128 is coupled to the landing pad 132 in the first PPI layer 124a by a via 129 in the second polymer layer 120b. In some embodiments, a connector 136 is coupled to or is coupleable to the PPI pad 128.

The top view shown in FIG. 2 illustrates some shapes, dimensions, and relative dimensions of the PPI line 130, the landing pad 132, the via 129, and the PPI pad 128 of the design of the interconnect structure 126 shown in FIG. 1. The landing pad 132 is larger than the via 129 on sides of the via 129 by a dimension $d_0$, wherein dimension $d_0$ comprises about 20 μm or less, about 2 μm to about 15 μm, or about 5 μm to about 10 μm in some embodiments. Dimension $d_0$ may also comprise other values, such as greater than about 20 μm. Dimension $d_0$ comprises a distance from an edge of the via 129 to an edge of the landing pad 132, for example. A diameter or width of the landing pad 132 of the design of the interconnect structure 126 is less than a diameter or width of the PPI pad 128. The diameter or width of the PPI pad 128 is not labeled in FIGS. 1 and 2: see dimension $d_3$ in FIGS. 3 and 4, which will be described further herein.

Figure 3:
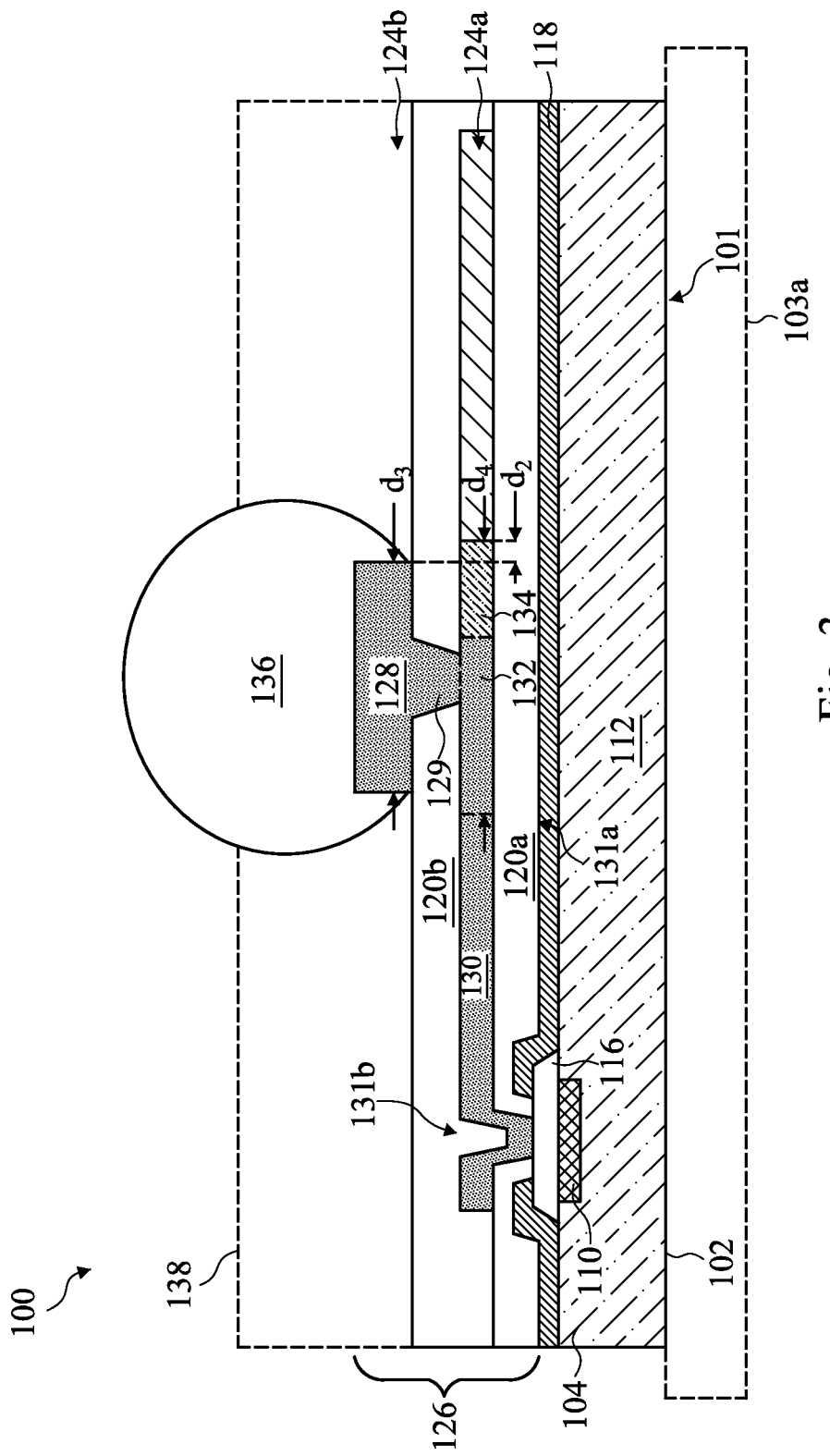
FIG. 3 illustrates a cross-sectional view of a design for an interconnect structure of a packaged semiconductor device in accordance with some embodiments of the present disclosure, wherein a shadow pad material is disposed proximate the landing pad of the interconnect structure and proximate the PPI pad.
Figure 4:
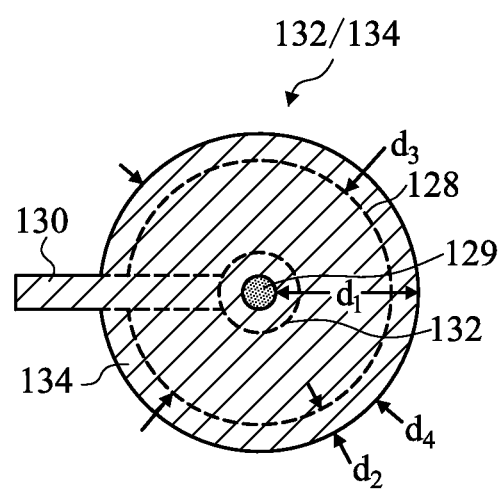
FIG. 4 shows a top view of a PPI pad, landing pad, PPI line, and shadow pad material of the design of the interconnect structure shown in FIG. 3 in accordance with some embodiments.

In accordance with some embodiments of the present disclosure, the design of the interconnect structure 126 shown in FIGS. 1 and 2 is altered or modified to include additional material in the first PPI layer 124a, which additional material is also referred to herein in some embodiments as a shadow pad material (see shadow pad material 134 shown in FIGS. 3 and 4). The shadow pad material 134 is formed within the first PPI layer 124a. The shadow pad material 134 is also formed proximate the PPI pad 128 in the second PPI layer 124b. The shadow pad material 134 is included in the first PPI layer 124a proximate the landing pad 132 which overlies a portion of the shadow pad material 134, for example. Some portions of the shadow pad material 134 are formed beneath the PPI pad 128, and other portions of the shadow pad material 134 are formed that extend beyond edges of the PPI pad 128 to form an enlarged shadow shape of the PPI pad 128 beneath the PPI pad 128. In some embodiments, altering the interconnect structure comprises including a first portion of the shadow pad material 134 disposed beneath the PPI pad 128 and including a second portion of the shadow pad material 134 that extends past an edge of the PPI pad 128, for example.

In some embodiments, at least a portion of the shadow pad material 134 is disposed laterally around at least a portion of the PPI pad 128, for example. As another example, in some embodiments, at least a portion of the shadow pad material 134 extends laterally beyond lateral boundaries of the PPI pad 128.

The shadow pad material 134 is disposed around a portion of the landing pad 132, enlarging the total amount of conductive material of the first PPI layer 124a that resides below and proximate the PPI pad 128. The shadow pad material 134 is also disposed proximate the PPI line 130 coupled to the landing pad 132. In some embodiments, the shadow pad material 134, combined with the landing pad 132, the PPI line 130, and other elements disposed within the first PPI layer 124a beneath and proximate the PPI pad 128, comprises a substantially same or similar shape as the PPI pad 128, in an enlarged size, in comparison with the PPI pad 128. Thus, in some embodiments, the shadow pad material 134 and other elements disposed within the first PPI layer 124a beneath and proximate the PPI pad 128 have an appearance of a shadow of the PPI pad 128, for example.

In some embodiments, the shape of the shadow pad material or materials 134 is selected as a function of other elements within the first PPI layer 124a beneath and proximate the PPI pad 128 to achieve a desired overall PPI pad shadow shape of conductive material in the first PPI layer 124a disposed beneath and proximate the PPI pad 128. Thus, a shape of the shadow pad material or materials 134 may vary for each PPI pad 128 in an interconnect structure 126, based on the shape and presence of other elements, such as landing pads 132 and PPI lines 130, beneath and proximate each of the PPI pads 128, in some embodiments.

FIG. 3 illustrates a cross-sectional view of a design for an interconnect structure 126 of a portion 100 of a packaged semiconductor device (see packaged semiconductor device 140 shown in FIGS. 12 and 13) in accordance with some embodiments, wherein the shadow pad material 134 is disposed proximate the landing pad 132 of the interconnect structure 126 within the first PPI layer 124a and proximate the overlying PPI pad 128 within the second PPI layer 124b. FIG. 4 shows a top view of the PPI pad 128, landing pad 132, PPI line 130, and shadow pad material 134 of the design of the interconnect structure 126 shown in FIG. 3 in accordance with some embodiments. The top view shown in FIG. 4 illustrates some shapes, dimensions, and relative dimensions of the PPI line 130, the landing pad 132, the shadow pad material 134, the via 129, and the PPI pad 128 of the design of the interconnect structure 126 in accordance with some embodiments.

In some of the embodiments shown in FIG. 4, the shadow pad material 134 is coupled to the landing pad 132. The shadow pad material 134 is formed directly abutting and adjacent the landing pad 132 in some embodiments, for example. The shadow pad material 134 is also disposed proximate a portion of the PPI line 130. The shadow pad material 134 is formed directly abutting and adjacent a portion of the PPI line 130 beneath and proximate the PPI pad 128 in the embodiments shown in FIG. 4, for example.

The landing pad 132, the shadow pad material 134, and the portion of the PPI line 130 are larger than the via 129 on sides of the via 129 by a dimension $d_1$, wherein dimension $d_1$ comprises about 10 µm to about 100 µm, or about 12 µm to about 80 µm in some embodiments. Dimension $d_1$ comprises a distance from an edge of the via 129 to an edge of the shadow pad material 134, for example. The via 129 may comprise a diameter of about 20 µm to about 150 µm in some embodiments. Dimension $d_1$ and the diameter of the via 129 may also comprise other values.

The diameter or width of the PPI pads 128 comprises a dimension $d_3$, wherein dimension $d_3$ comprises about 220 µm or less, about 150 µm to about 210 µm, about 160 µm to about 200 µm, or about 170 µm to about 190 µm, in some embodiments. Dimension $d_3$ may also comprise other values, such as about 220 µm or greater.

The diameter or width of the shadow pad material 134 comprises a dimension $d_4$, wherein dimension $d_4$ is greater than the diameter or width of the PPI pad 128 comprising dimension $d_3$. Dimension $d_4$ comprises an outer diameter or outer width of the shadow pad material 134 in the embodiments shown in FIG. 4. Dimension $d_4$ comprises a distance between one edge of the shadow pad material 134 to an opposite edge of the shadow pad material 134 in a top view, for example. The diameter or width of the shadow pad material 134 comprising dimension $d_4$ is greater than the diameter or width of the PPI pad 128 comprising dimension $d_3$ on a side of the PPI pad 128 by an amount comprising a dimension $d_2$ in some embodiments. Dimension $d_2$ comprises about 5 µm to about 20 µm, in some embodiments. Dimension $d_2$ comprises an amount that is sufficient to release stress of the overlying PPI pad 128 in some embodiments, for example. In some embodiments, dimension $d_2$ along an entire side or sides of the PPI pad 128 is substantially the same, so that stress of the PPI pad 128 is released uniformly. The landing pad 132 and shadow pad material 134 patterns or shapes are symmetric relative to the position of the PPI pad 128 in some embodiments. For example, the shadow pad material 134 and the PPI pad 128 are concentric in some embodiments.

The shadow pad material 134 is disposed laterally around a portion of the PPI pad 128, and a portion of the shadow pad material 134 extends laterally beyond lateral boundaries of the PPI pad 128. For example, a portion of the shadow pad material 134 extends laterally past edges of the PPI pad 128, as illustrated in the top view of FIG. 4. Another portion of the shadow pad material 134 is disposed beneath the PPI pad 128 within the edges of the PPI pad 128.

The shadow pad material 134 is disposed around a portion of the landing pad 132 in the same material layer that the landing pad 132 and PPI line 130 are formed in, and the shadow pad material 134 comprises the same material as the landing pad 132 and the PPI line 130, in some embodiments. The shadow pad material 134 is disposed proximate the landing pad 132 and proximate a portion of the PPI line 130. The shadow pad material 134 is disposed adjacent a portion of the PPI line 130 in the embodiments shown in FIG. 4; thus, the shadow pad material 134 is electrically coupled to the PPI line 130. The shadow pad material 134 is coupled to the same element or electrical function elsewhere in the interconnect structure 126 that the PPI line 130, landing pad 132, and PPI pad 128 are coupled to. For example, the shadow pad material 134 may be coupled to a signal line, a ground line, a power line, or other types of electrical connections or functions.

The shadow pad material 134 and landing pad 132 comprise a continuous portion of material in the embodiments shown in FIG. 4. For example, the shadow pad material 134 and landing pad 132 are connected. The shadow pad material 134 is coupled to the landing pad 132 in some embodiments. The materials of the shadow pad material 134 and landing pad 132 may not be continuous and may not be connected, in other embodiments, which will be described further herein.

The shadow pad material 134 substantially comprises a shape of a portion of a circle or a portion of an annulus in the embodiments shown in FIG. 4. For example, the shadow pad material 134 comprises a shape of a portion of a circle or a portion of an annulus disposed around the landing pad 132 and proximate a portion of the PPI line 130. The shadow pad material 134 may also comprise other shapes, to be described further herein with reference to FIGS. 5 through 11, which illustrate top views of PPI pads 128, landing pads 132, PPI lines 130, and shadow pad materials 134 of an interconnect structure 126 of packaged semiconductor devices 140 in accordance with some embodiments.

Figure 5:
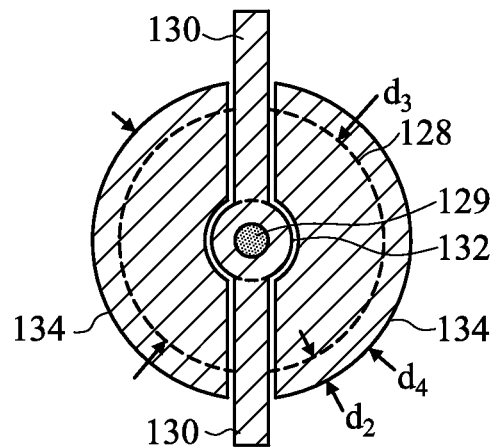
FIGS. 5 through 11 illustrate top views of PPI pads, landing pads, PPI lines, and shadow pad materials of an interconnect structure of packaged semiconductor devices in accordance with some embodiments.

In FIG. 5, the PPI line 130 coupled to the landing pad 132 extends from a first side of the landing pad 132 away from the landing pad 132. The PPI line 130 further extends past the landing pad 132 from a second side of the landing pad 132 away from the landing pad 132. For example, in FIG. 5, the PPI line 130 extends from a top of the drawing to the landing pad 132, and the PPI line 130 further extends past the landing pad 132 towards a bottom of the drawing. The PPI line 130 may also extend from or to other locations in the drawing and/or landing pad 132. The shadow pad material 134 substantially comprises a shape of two portions of a circle or two portions of an annulus that are disposed proximate the landing pad 132 and a portion of the PPI line 130. The shadow pad material 134 is not coupled to or connected to the landing pad 132 or the PPI line 130 in the embodiments shown in FIG. 5; rather, the shadow pad material 134 is disposed proximate the landing pad 132 and PPI line 130. The shadow pad material 134 may be spaced apart from the landing pad 132 and PPI line 130 by a predetermined distance, such as about 5 µm to about 10 µm, for example. The space between the shadow pad material 134 and the landing pad 132 and PPI line 130 may also comprise other values. In some embodiments, the shadow pad material 134 comprises a dummy conductive material disposed proximate the landing pad 132 and disposed beneath and proximate the PPI pad 128 that is not electrically coupled or connected to another conductive feature or element of the interconnect structure 126.

Thus, in some embodiments, a PPI line 130 may extend completely through the shadow pad material 134 to exit from another side of or another location on the landing pad 132 and PPI pad 128. The embodiments shown in FIG. 5 may also include a PPI line 130 that terminates at the landing pad 132, as illustrated in FIG. 4.

Note that the embodiments shown in FIG. 4 may also include a PPI line 130 that extends towards the landing pad 132 and shadow pad material 134 and also extends away from the landing pad 132 and shadow pad material 134, as shown in FIG. 5. For example, in FIG. 4, the PPI line 130 that extends from a first side of the landing pad 132 away from the landing pad 132 may be extended past the landing pad 132 from a second side of the landing pad 132 away from the landing pad 132, or in other locations along the sides of the PPI pad 128.

Figure 6:
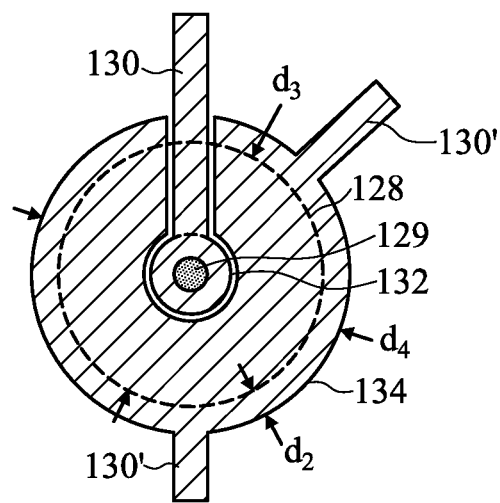

FIG. 6 illustrates some embodiments of the present disclosure wherein the shadow pad material 134 comprises a portion of a PPI line 130'. The shadow pad material 134 is disposed proximate the landing pad 132 and PPI line 130 and substantially comprises a shape of a portion of a circle or a portion of an annulus disposed proximate or around the landing pad 132 and proximate a portion of the PPI line 130. A PPI line 130' extends from a first side of the landing pad 132 away from the landing pad 132 and from a second side of the landing pad 132 away from the landing pad 132. A portion of the shadow pad material 134 is coupled to the PPI line 130', widening or enlarging the PPI line 130' proximate the first and second sides of the landing pad 132 into a circular or annular shape (e.g., on the right side of the drawing in the embodiments shown in FIG. 6). Another portion of the shadow pad material 134 curves upwardly around the landing pad 132 in a circular or annular shape (e.g., on the left side of the drawing in the embodiments shown in FIG. 6). In some embodiments, the PPI line 130 comprises a first PPI line 130, and the PPI line 130' comprises a second PPI line 130' that is proximate the landing pad 132, the first PPI line 130, and/or the shadow pad material 134 (i.e., the PPI line 130' includes the shadow pad material 134 in some embodiments). The PPI line 130' is coupled to the shadow pad material 134 in some embodiments illustrated in FIG. 6, for example. The shadow pad material 134 is electrically coupled to the same signal line, ground line, power line, or other types of electrical connection or function that the PPI line 130' is coupled to.

Note that in the embodiments shown in FIG. 6, the second PPI line 130' may extend away from the landing pad 132 in one location along the shadow pad material 134. Likewise, the first PPI line 130 may extend away from the landing pad 132 in two locations. The first PPI line 130 and/or the second PPI line 130' may extend away from the landing pad 132 in one, two, or three or more locations, in some embodiments, for example.

Figure 7:
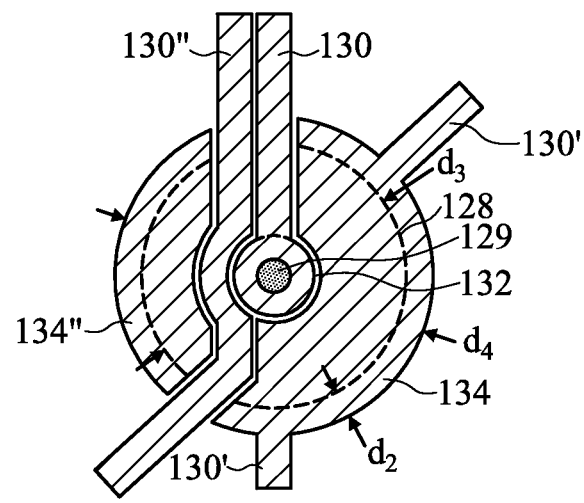

FIG. 7 illustrates some embodiments wherein three PPI lines 130, 130', and 130" are disposed proximate the landing pad 132 and the PPI pad 128. A first PPI line 130 is coupled to the landing pad 132, as illustrated in the embodiments shown in FIG. 6. A first portion of shadow pad material 134 comprises a portion of a second PPI line 130'. For example, the first portion of the shadow pad material 134 substantially comprises an enlarged or widened portion of PPI line 130', as described for the embodiments shown in FIG. 6. A third PPI line 130" is disposed proximate the landing pad 132, the PPI line 130, and the PPI line 130' that includes the first portion of shadow pad material 134. A second portion of shadow pad material, labeled 134" in FIG. 7, is disposed proximate the third PPI line 130" and proximate the landing pad 132. The second portion of shadow pad material 134" substantially comprises a shape of a portion of a circle or a portion of an annulus. A diameter or width of the shadow pad material 134 and 134" from an outer edge of the first portion of shadow pad material 134 to an outer edge of the second portion of shadow pad material 134" comprising dimension $d_4$ is greater than the diameter or width comprising $d_3$ of the PPI pad 128.

The PPI lines 130, 130', and 130" and shadow pad materials 134 and 134" may be spaced apart from one another by a predetermined amount, such as about 5 μm to about 10 μm, for example. The PPI lines 130, 130', and 130" and shadow pad materials 134 and 134" may also be spaced apart by other dimensions.

Figure 8:
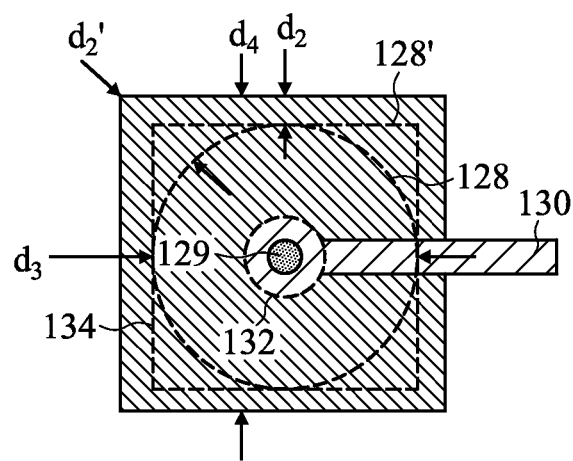

FIG. 8 illustrates some embodiments wherein the shadow pad material 134 substantially comprises a shape of a portion of a square. The shadow pad material 134 is disposed around the landing pad 132 beneath and proximate the PPI pad 128. FIG. 8 also illustrates that the PPI pad may comprise a shape of a square, as shown in phantom at 128'.

Dimension $d_2$ may not be the same on all portions of the sides of the shadow pad material 134 in the embodiments shown in FIG. 8, for example. In embodiments wherein the PPI pad 128 is circular, corners of the square-shaped shadow pad material 134 have a greater dimension $d_2'$ than dimension $d_2$ in other regions of the square-shaped shadow pad material 134 that extend past the PPI pad 128.

The other embodiments illustrated in FIGS. 5 through 7 may also be included in the embodiments shown in FIG. 8, such as including a PPI line 130 that extends completely underneath the PPI pad 128 as shown in FIG. 5, a shadow pad material 134 comprising a portion of a PPI line 130' as shown in FIG. 6, a third PPI line 130" disposed beneath the PPI pad 128 and two or more portions of the shadow pad material 134 and 134" as shown in FIG. 7, and/or the shadow pad material 134 being disposed proximate but not coupled to the landing pad 132 and PPI line 130, as shown in FIGS. 5, 6, and 7.

Figure 9:
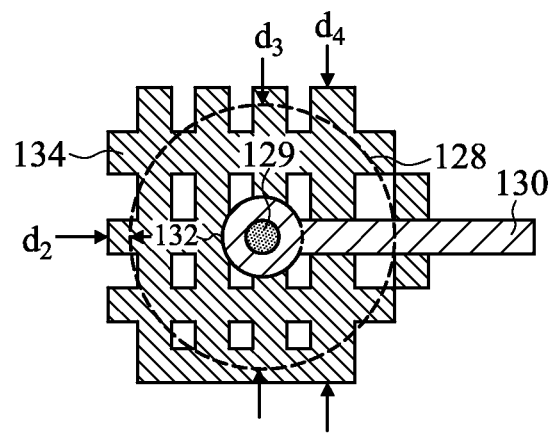
Figure 10:
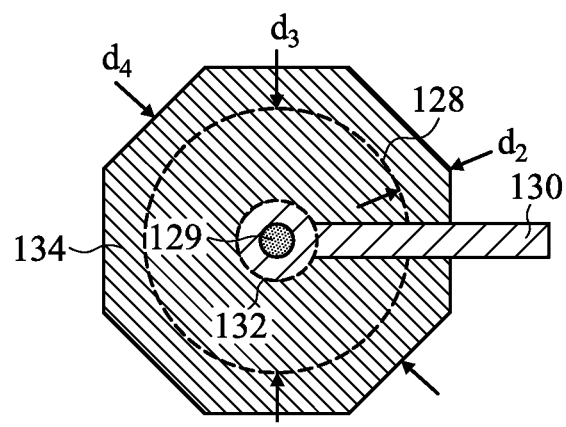

FIG. 9 illustrates some embodiments wherein the shadow pad material 134 substantially comprises a shape of a mesh or a portion of a mesh, and FIG. 10 illustrates some embodiments wherein the shadow pad material 134 substantially comprises a shape of a portion of a polygon, such as an octagon. The shadow pad material 134 may also comprise other geometrical shapes or portions of geometrical shapes. The embodiments shown in FIG. 5 may also be implemented in some of the embodiments shown in FIGS. 8, 9, and 10. For example, in FIG. 5, the shadow pad material 134 substantially comprises a shape of portions of a circle or an annulus. The shadow pad material 134 shown in FIG. 5 may also comprise a shape of portions of a square, portions of a mesh, or portions of a polygon, as shown in FIGS. 8, 9, and 10, respectively. Likewise, the embodiments shown in FIGS. 6 and 7 may include shadow pad materials 134 and 134" in the shape of portions of a square, portions of a mesh, or portions of a polygon.

Figure 11:
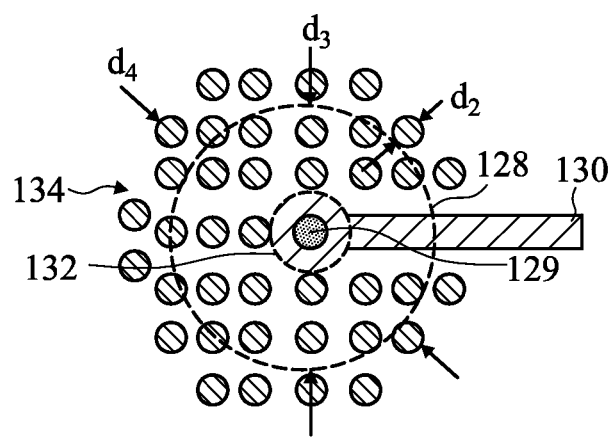

In other embodiments, the shadow pad material 134 may comprise a plurality of circles, as shown in FIG. 11. The shadow pad material 134 may comprise an array (e.g., staggered or non-staggered) of plugs of material having a substantially circular shape in some embodiments, for example. The shadow pad material 134 may also substantially comprise a shape of a plurality of squares, a plurality of polygons, or a plurality of other shapes, in other embodiments. The embodiments illustrated in FIG. 11 may also be implemented with the embodiments illustrated in FIGS. 6 through 10.

Thus, in some embodiments, the shadow pad material 134 substantially comprises a shape in a top view of a packaged semiconductor device 140 of a portion of a circle, a portion of an annulus, a portion of a square, a portion of a polygon, a mesh, a portion of a mesh, a plurality of circles, a plurality of squares, a plurality of polygons, and/or a combination thereof. The shadow pad material 134 may also comprise other shapes.

In some embodiments, a material disposed beneath the PPI pad 128 substantially comprises a shape of an enlarged shadow of the PPI pad 128. For example, in the embodiments illustrated in FIGS. 4 through 6 and FIGS. 9 and 10, the material disposed beneath the PPI pad 128 includes the landing pad 132, a portion of the PPI line 130, and the shadow pad material 134. The landing pad 132, the portion of the PPI line 130 disposed beneath and proximate the PPI pad 128, and the shadow pad material 134 may substantially comprise the shape of an enlarged shadow of the overlying PPI pad 128. Likewise, in the embodiments shown in FIG. 7, the landing pad 132, the portion of the PPI lines 130, 130', and 130" disposed beneath and proximate the PPI pad 128, and the shadow pad materials 134 and 134" may substantially comprise the shape of an enlarged shadow of the overlying PPI pad 128. In some of the embodiments shown in FIG. 8 wherein the PPI pad 128' substantially comprises a shape of a square, the underlying material comprising the landing pad 132, a portion of the PPI line 130, and the shadow pad material 134 substantially comprise the shape of an enlarged shadow of the overlying PPI pad 128', as another example.

Referring again to FIG. 3, a method of packaging a semiconductor device at various stages in accordance with some embodiments of the present disclosure will next be described in more detail. In some embodiments, first, a carrier 103a is provided, and an integrated circuit die 101 is coupled to the carrier 103a. The carrier 103a comprises a wafer or other type of substrate that is used for the packaging process as a platform for packaging one or more integrated circuit dies 101. The carrier 103a is later removed after packaging a plurality of integrated circuit dies 101 in some embodiments, for example.

The integrated circuit die 101 comprising a substrate 102 having electrical circuitry 112 formed thereon is shown in accordance with an embodiment. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on the substrate 102, which typically comprises a silicon, other semiconductor material, or glass substrate. Other substrates, such as a multi-layered or gradient substrate may also be used.

The electrical circuitry 112 of the substrate 102 may be any type of circuitry suitable for a particular application. In an embodiment, the electrical circuitry 112 includes electrical devices formed on the substrate 102 with an insulating material 104 comprising one or more dielectric layers overlying the electrical devices. Metal layers may be formed within, on, and/or between the insulating material 104 to route electrical signals between the electrical devices, such as conductive lines and vias, not shown. Electrical devices may be formed in one or more dielectric layers of the insulating material 104. As other examples, electrical circuitry 112 formed within or on the substrate 102 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, or the like. One of ordinary skill in the art will appreciate that the above examples are provided for illustrative purposes to further explain applications of some illustrative embodiments and are not meant to limit the disclosure in any manner. Other circuitry may be used as appropriate for a given application.

In some embodiments, the insulating material 104 or a portion thereof comprises an inter-layer dielectric (ILD) layer that may be formed, for example, of a low dielectric constant (low-K) dielectric material, such as phosphosilicate glass (PSG), borophosphosilicate glass (BPSG), fluorinated silicate glass (FSG), SiOxCy, spin-on-glass (SOG), spin-on-polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma CVD (HDPCVD), or the like. The insulating material 104 may comprise a plurality of dielectric layers in some embodiments.

Contact pads, such as contact pad 110 illustrated in FIG. 3, are formed within, on, and/or through the insulating material 104 to provide an electrical contact to the electrical circuitry 112 of the substrate 102. The contact pad 110 may be formed, for example, using photolithography techniques to deposit and pattern a photoresist material formed over the insulating material 104 to expose portions of the insulating material 104 that are to become the contact pad 110. An etch process, such as an anisotropic dry etch process, may be used to create openings in the insulating material 104. The openings may be lined with a diffusion barrier layer and/or an adhesion layer (not shown), and filled with a conductive material using a damascene process. In some embodiments, the diffusion barrier layer comprises one or more layers of TaN, Ta, TiN, Ti, CoW, or the like, and the conductive material comprises copper, tungsten, aluminum, silver, and combinations thereof, or the like, thereby forming the contact pad 110 illustrated in FIG. 3. The contact pad 110 may also be formed using a subtractive process, by depositing a conductive material over the insulating material 104, and patterning the conductive material using photolithography to form the contact pad 110.

The insulating material 104 or a portion thereof may also comprise one or more inter-metal dielectric (IMD) layers that comprise conductive lines and vias. In some embodiments, the insulating material 104 comprises IMD layers disposed over an ILD layer. Generally, the insulating material 104 of the integrated circuit die 101 may include one or more IMD and/or ILD layers and associated metallization layers that are used to interconnect electrical circuitry of the substrate 102 to each other and also to provide external electrical connections for the integrated circuit die 101.

It should be noted that one or more etch stop layers (not shown) may be positioned between adjacent ones of the dielectric layers of the insulating material 104, for example, between the dielectric layers of the ILD layer and/or the IMD layers of the insulating material 104. Generally, the etch stop layers provide a mechanism to stop an etching process when forming vias and/or contacts (not shown). The etch stop layers are formed of a dielectric material having a different etch selectivity to adjacent layers, such as the underlying semiconductor substrate 102 and overlying and underlying insulating layers of the insulating material 104. In some embodiments, etch stop layers of the insulating material 104 may be formed of SiN, SiCN, SiCO, CN, combinations thereof, or the like, deposited by CVD, PECVD, or other methods.

In some embodiments, the contact pads 110 are provided in an uppermost IMD layer of the insulating material 104 to provide external electrical connections to the electrical circuitry 112 of the substrate 102. Contact pads 116 may be formed over contact pads 110 in some embodiments. Contact pads 116 may comprise aluminum pads or aluminum-copper pads, although other metallic materials may be used. In some embodiments, contact pads 116 are not included.

In some embodiments, a passivation layer 118 is formed over the insulating material 104 of the integrated circuit die 101. The passivation layer may be formed of a dielectric material, such as SiN, plasma-enhanced oxide (PEOX), plasma-enhanced SiN (PE-SiN), plasma-enhanced undoped silicate glass (PE-USG), or the like. The passivation layer 118 is formed such that at least a portion of the contact pad 110 or contact pad 116 is exposed. The passivation layer 118 may be formed by a blanket deposition and patterned using a photolithography process to provide an opening over the contact pad 110 or 116 and to protect the underlying layers from various environmental contaminants. In some embodiments, the passivation layer 118 is not included.

The first polymer layer 120a is formed over the substrate 102; e.g., over the insulating material 104 and the contact pad 110 or 116, or over the passivation layer 118 and the contact pad 110 or 116, in embodiments wherein the passivation layer 118 is included. The first polymer layer 120a may be formed of a polymer such as polybenzoxazole (PBO), polyimide (PI), epoxy, benzocyclobutene (BCB), molding compound, and the like, or a combination thereof. The first polymer layer 120a may comprise a thickness of about 3 μm to about 30 μm, for example. The thickness of the first polymer layer 120a may be greater than 30 μm in some embodiments. The formation methods for the first polymer layer 120a may include spin-coating, dispensing, thermal compression, CVD, physical vapor deposition (PVD), or other methods, for example. A curing step may be performed to cure the first polymer layer 120a. The first polymer layer 120a may also comprise other materials, dimensions, and formation methods.

The first polymer layer 120a is patterned using a lithography process, by forming a layer of photoresist (not shown) over the first polymer layer 120a, and exposing the photoresist to energy reflected from or through a lithography mask (also not shown) having a desired pattern thereon. The photoresist is then developed, and exposed (or unexposed, depending on whether the photoresist comprises a positive or negative photoresist) portions of the photoresist are ashed and/or etched away. The patterned layer of photoresist is then used as an etch mask during an etch process for the first polymer layer 120a. The layer of photoresist is then removed using an ashing and/or etch process.

The patterned first polymer layer 120a comprises an opening over the contact pad 110 and/or contact pad 116 so that electrical connection may be made to the contact pad 110 and/or 116 by the interconnect structure 126.

Next, an interconnect structure 126 is formed over the first polymer layer 120a and the contact pad 110 and/or 116. The interconnect structure 126 comprises a redistribution layer (RDL) that provides electrical connections in a horizontal direction for the packaged semiconductor device in some embodiments, for example. To form the interconnect structure 126, a conductive material is formed over the patterned first polymer layer 120a. The conductive material comprises copper, a copper alloy, other metals, or other conductive materials in some embodiments. The conductive material may comprise a thin layer, e.g., comprising a thickness of about 2 μm to about 3 μm or less, of titanium or other seed material that is formed using a sputtering process, and a layer of copper, a copper alloy, or other metal that is electro-plated over the layer of titanium, in some embodiments. The overall thickness of the conductive material comprises about 3 μm to about 30 μm, for example. In other embodiments, the conductive material may be a multi-layered structure, such as a copper layer coated with electro-less nickel or electro-less palladium immersion gold (EN-EPIG), which includes a nickel layer, a palladium layer on the nickel layer, and a gold layer on the palladium layer. The gold layer may be formed using immersion plating. The conductive material may also comprise other materials, dimensions, and formation methods.

The conductive material is then patterned to form the PPI line 130, landing pad 132, and shadow pad material 134. The conductive material may be patterned in some embodiments using a lithography process, similar to the lithography process described for the first polymer layer 120a, using an etch chemistry suited for the conductive material. The PPI line 130, landing pad 132, and shadow pad material 134 may also be formed by plating the conductive material through a patterned masking material (not shown) formed over the first polymer layer 120a, for example. In some embodiments wherein the conductive material comprises copper or a copper alloy, a plating process may be used to form the conductive material, for example. The masking material is then removed after the plating process. The PPI line 130, landing pad 132, and shadow pad material 134 comprise a first PPI layer 124a in some embodiments.

A second polymer layer 120b is formed over the first PPI layer 124a and the first polymer layer 120a. The second polymer layer 120b may comprise similar materials, dimensions, and formation methods as the first polymer layer 120a. The second polymer layer 120b is patterned using a lithography process to form an opening for a via 129 in the second polymer layer 120b over the landing pad 132.

A conductive material is then formed over the patterned second polymer layer 120b using a deposition and lithography process, or a plating process, forming the PPI pad 128 and the via 129. The conductive material for the PPI pad 128 and the via 129 and formation process thereof comprise similar materials, dimensions, and formation methods as described for the conductive material for the PPI line 130, landing pad 132, and shadow pad material 134, for example. The PPI pad 128 comprises a second PPI layer 124b in some embodiments.

The first PPI layer 124a and the second PPI layer 124b comprise an interconnect structure 126 that includes a PPI, RDL, or other type of interconnect structure. The interconnect structure 126 includes the PPI pad 128 disposed over the second polymer layer 120b that is coupled to the contact pad 110 and/or 116 of the integrated circuit die 101 by the via 129, landing pad 132, and PPI line 130. The PPI pad 128 disposed over the second polymer layer 120b provides an electrical connection upon which an electrical connector 136, such as a solder ball or bump, may be placed. Other conductive traces or PPI lines may also be formed during the formation process for the conductive materials of the PPI lines 130, landing pads 132, shadow pad material 134, vias 129, and/or PPI pads 128.

The PPI line 130, landing pad 132, and shadow pad material 134 are formed from the same conductive material layer. In some embodiments, the PPI line 130, landing pad 132, and shadow pad material 134 are integral to one another and comprise a continuous portion of the conductive material in some embodiments, such as the embodiments shown in FIGS. 4, 8, and 10. Only one PPI pad 128, PPI line 130, landing pad 132, via 129, and shadow pad material 134 are shown in some of the drawings; however, a plurality of PPI pads 128, PPI lines 130, landing pads 132, vias 129, and shadow pad materials 134 are formed across a surface of the packaging device and are used for making external electrical connections in accordance with some embodiments. The PPI pad 128, PPI line 130, landing pad 132, via 129, and shadow pad material 134 comprise a redistribution layer (RDL) or other interconnect routing structure of the portion 100 of the packaging device in some embodiments, for example.

Generally, the via 129, landing pad 132, and PPI line 130 provide an electrical connection from a contact pad 110 and/or 116 of the integrated circuit die 101 to the PPI pad 128. The PPI pad 128 is an enlarged region disposed over the second polymer layer 120b that is designed to accommodate an external electrical connection by a connector 136, such as a solder ball. The PPI pad 128 illustrated in FIGS. 4 through 11 is circular and the PPI pad 128' illustrated in FIG. 8 is square, although other shapes may be used.

The PPI line 130 may have a narrow, wide, or tapered shape. The PPI line 130 may comprise a substantially constant thickness and width. The PPI line 130 is shown as a straight line in some of the drawings; however, in some embodiments, the PPI line 130 may comprise a meandering shape. The PPI line 130 comprises a first end 131a and a second end 131b opposite the first end 131a. The first end 131a of the PPI line 130 is coupled to the PPI pad 128, and the second end 131b of the PPI line 130 is coupled to the contact pad 110 or 116 of the integrated circuit die 101 in some embodiments.

A connector 136 is then coupled to the PPI pad 128 in some embodiments, also shown in FIG. 3. The PPI pad 128 is used to connect to the connector 136, forming a connection between the contact pad 110 and/or 116 to the connector 136 by way of the PPI line 130, landing pad 132, via 129, and the PPI pad 128. The connector 136 may have a larger diameter or smaller diameter than the diameter or width of the PPI pad 128.

In some embodiments, the connector 136 comprises a eutectic material and may comprise a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Alternatively, lead-free solder connectors may include tin and silver, Sn—Ag, without the use of copper. The connector 136 may be one among an array of the connectors 136 as a grid, referred to as a "ball grid array" or "BGA". The connectors 136 may alternatively be arranged in other shapes. The connector 136 comprises a conductive ball having a shape of a partial sphere in some embodiments. Alternatively, the connector 136 may comprise other shapes. The connector 136 may also comprise non-spherical conductive connectors, for example.

The connector 136 is attached to the PPI pad 128 in some embodiments using a solder ball drop process. During the connector 136 mounting process, or after the connector 136 mounting process, the eutectic material of the connector 136 may be re-flowed. In some embodiments, a material of the connector 136 comprises a eutectic material such as solder that is adapted to melt at a predetermined temperature, for example. The connector 136 may comprise a solder ball or solder bump in some embodiments, as examples. The connector 136 may also comprise other types of connection devices, such as conductive bumps, conductive balls, conductive pillars, non-spherical connectors, or other connectors. When the eutectic material of the connector 136 cools, the connector 136 may be used to electrically and mechanically couple a packaged semiconductor device 140 to another device or object.

A molding material 138 is then formed over exposed portions of the second polymer layer 120b and around the connector 136 and the PPI pad 128 in some embodiments, as shown in phantom in FIG. 3. A top portion of the molding material 138 may be recessed so that a top portion of the connector 136 is exposed. An amount of the molding material 138 applied may also be controlled so that the top portion of the connector 136 is exposed. A molding compound clamp may be applied during a curing process and a plasma treatment process of the molding material 138 in some embodiments, for example.

The molding material 138 comprises a molding compound comprised of an insulating material, such as an epoxy, a filler material, a stress release agent (SRA), an adhesion promoter, other materials, or combinations thereof, as examples. The molding material 138 comprises a liquid or gel when applied so that it flows between and around the connectors 136, in some embodiments. The molding material 138 is then cured or allowed to dry so that it forms a solid.

In some embodiments, the interconnect structure 126 of the portion 100 of the packaged semiconductor device 140 comprises an underball metallization (UBM)-free fan-in (UFI) interconnect structure having two redistribution layers (RDLs): the first PPI layer 124a and the second PPI layer 124b. The UFI interconnect structure 126 advantageously does not require a UBM structure, providing a time and cost savings.

Figure 12:
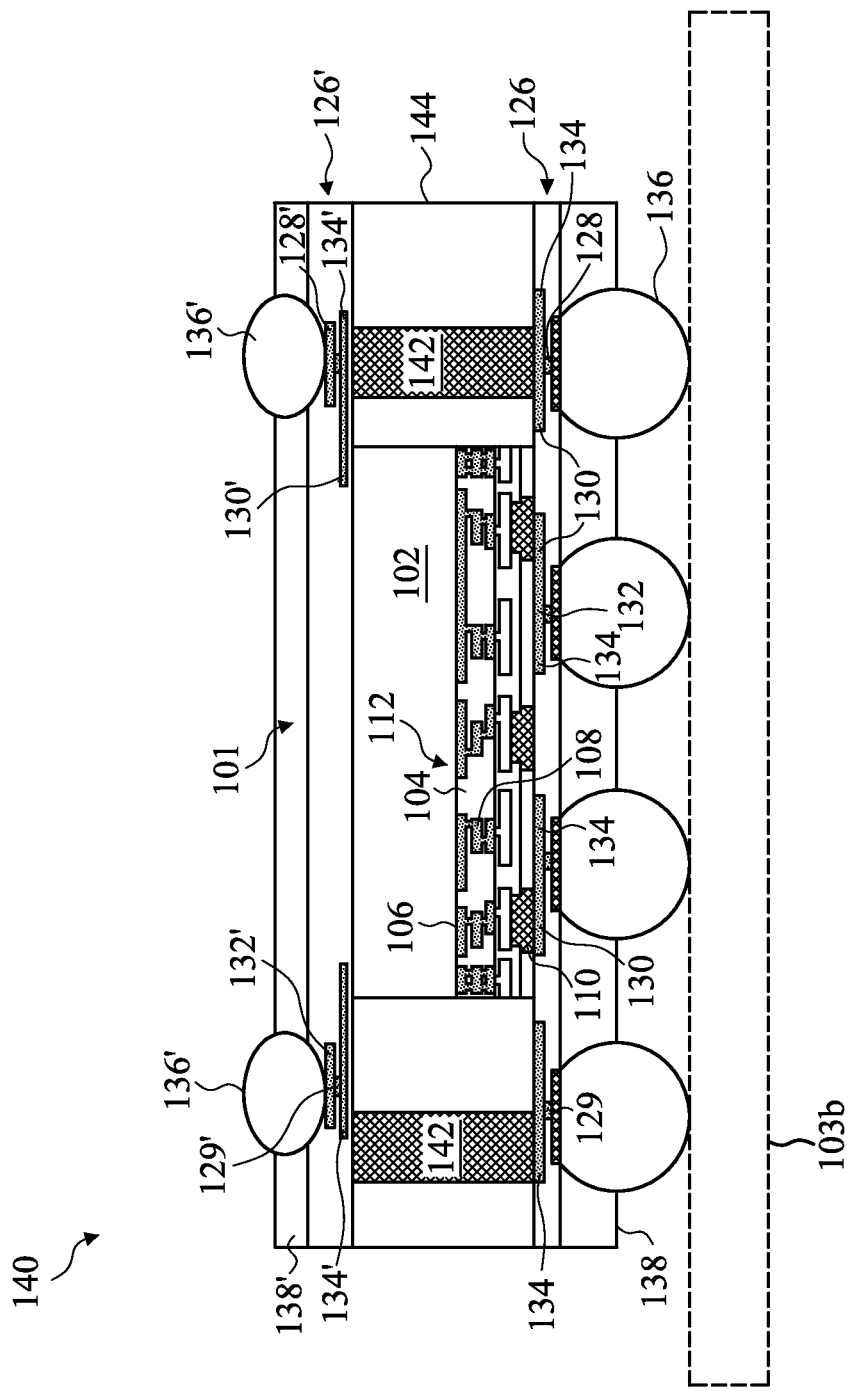
FIG. 12 is a cross-sectional view of a packaged semiconductor device in accordance with some embodiments that includes the shadow pad material in an interconnect structure or structures.

FIG. 12 is a cross-sectional view of a packaged semiconductor device 140 in accordance with some embodiments that may include the portions 100 of the packaged semiconductor devices shown in and described with reference to FIGS. 3 through 11 herein. The portions 100 of the packaged semiconductor devices described with reference to FIGS. 1 through 11 are inverted in the view shown in FIG. 12. Additional elements and features of the packaged semiconductor device 140 are also shown.

The integrated circuit die 101 comprises a first side comprising a bottom side in FIG. 12. The integrated circuit die 101 also comprises a second side opposite the first side, wherein the second side comprises a top side in FIG. 12. The polymer layers 120a and 120b, the PPI pad 128, via 129, landing pad 132, shadow pad material 134, and the PPI line 130 shown and described for the embodiments illustrated in FIGS. 3 through 11 comprise a first interconnect structure 126 disposed proximate the first side of the integrated circuit die 101. The packaged semiconductor device 140 further includes a second interconnect structure 126' disposed proximate the second side of the integrated circuit die 101. In some embodiments, the second interconnect structure 126' may (or may not) include the PPI pads 128, vias 129, landing pads 132, shadow pad material 134, and PPI lines 130 described herein, as shown at 128', 129', 132', 134' and 130', respectively. Likewise, connectors 136 may (or may not) be coupled to the PPI pads 128', as shown at 136', and a molding material 138 may (or may not) be formed over the second interconnect structure 126' and around the connectors 136', as shown at 138'. In other embodiments, only the second interconnect structure 126' includes the PPI pads 128', vias 129', landing pads 132', PPI lines 130', shadow pad material 134', connectors 136', molding material 138' described herein. Thus, either the first interconnect structure 126, the second interconnect structure 126', or both the first interconnect structure 126 and the second interconnect structure 126' may include the shadow pad material 134 or 134' disposed proximate the PPI pads 128 or 128' and landing pads 132 or 132', in accordance with some embodiments of the present disclosure.

To package the semiconductor device which comprises an integrated circuit die 101 in some embodiments, first, a carrier 103a is provided as shown in phantom in FIG. 3. A plurality of through-vias 142 (see FIG. 12) may be formed over the carrier 103a by plating, photolithography, or other methods, before or after a plurality of the integrated circuit dies 101 is coupled to the carrier 103*a*. The plurality of through-vias 142 may be formed using an electro-plating process, by depositing a seed layer (not shown) over the carrier 103*a*, and forming a patterned mask (also not shown) with a desired pattern for the through-vias 142 over the seed layer. The through-vias 142 are plated onto the carrier 103*a* through the patterned mask, and the patterned mask is then removed. The exposed portions of the seed layer are also removed. The through-vias 142 may comprise copper, a copper alloy, or other metals or conductive materials. Dozens or hundreds of through-vias 142 may be included in a package for each of the integrated circuit dies 101 or groups of integrated circuit dies 101 that are packaged together, for example. The plurality of through-vias 142 provides electric connections in a vertical direction for the packaged semiconductor devices 140 in some embodiments. Each of the plurality of through-vias 142 may be positioned so that they will be coupled to a conductive portion of the interconnect structure 126 that will later be formed, for example.

A plurality of the integrated circuit dies 101 is coupled to the carrier 103*a* between some of the plurality of through-vias 142 in some embodiments. Only one integrated circuit die 101 is shown in FIG. 12; in some embodiments, a plurality of integrated circuit dies 101 is coupled to the carrier 103*a* and is packaged simultaneously. The integrated circuit dies 101 or two or more integrated circuit dies 101 are later singulated along scribe lines (i.e., of the package or interconnect structure 126) to form a plurality of packaged semiconductor devices 140. The plurality of integrated circuit dies 101 is coupled to the carrier 103*a* using a die attach film (DAF) disposed on a bottom surface of the integrated circuit dies 101. The plurality of integrated circuit dies 101 may comprise logic devices, processors, or other devices, as examples. The integrated circuit dies 101 are formed on a wafer (not shown), and the integrated circuit dies 101 are singulated along scribe lines to form the plurality of integrated circuit dies 101 in some embodiments. The plurality of integrated circuit dies 101 may be placed on the carrier 103*a* using a pick-and-place machine or manually, for example.

A molding material 144 is disposed over the carrier 103*a*, the plurality of integrated circuit dies 101, and the plurality of through-vias 142. The molding material 144 is disposed between the through-vias 142 and integrated circuit dies 101, between adjacent ones of the plurality of through-vias 142, and/or between adjacent ones of the plurality of integrated circuit dies 101, in some embodiments wherein two or more integrated circuit dies 101 are packaged together. The molding material 144 may comprise similar materials and application methods as described for molding material 138 shown in FIG. 3, for example. In some embodiments, as deposited, the molding material 144 extends over top surfaces of the plurality of integrated circuit dies 101 and the plurality of through-vias 142, and after the molding material 144 is applied, a top portion of the molding material 144 is removed using a planarization process, such as a CMP process, a grinding process, an etch process, or combinations thereof, as examples. Other methods may also be used to planarize the molding material 144. A top portion of the integrated circuit dies 101 and/or through-vias 142 may also be removed during the planarization process for the molding material 144.

The interconnect structure 126 described herein that includes the shadow pad material 134 and/or 134" is then formed over the molding material 144, the through-vias 142, and the integrated circuit dies 101. The connectors 136 are coupled to the PPI pads 128 of the interconnect structure 126, and the molding material 138 is applied in some embodiments, as previously described herein. In some embodiments, a plurality of the packaged semiconductor devices 140 is then singulated to form a completed packaged semiconductor device 140 that includes a single interconnect structure 126. The packaged semiconductor devices 140 may be singulated using a saw (not shown), which may include a blade comprising diamond or other materials in some embodiments, for example.

In other embodiments, a second interconnect structure 126' is formed, before singulating a plurality of the packaged semiconductor devices 140. A second carrier 103*b*, shown in phantom in FIG. 12, which may comprise a wafer or a carrier tape in some embodiments, is then coupled to the connectors 136, and the first carrier 101*a* shown in FIG. 3 is removed. The packaged semiconductor device 140 is then inverted, also shown in FIG. 12.

The second interconnect structure 126' is then formed over the bottom surface of the integrated circuit die 101, the molding material 144, and the through-vias 142. Connectors 136' are coupled to the interconnect structure 126', and a molding material 138' is formed around the connectors 136' over the second interconnect structure 126'. The second carrier 103*b* is then removed. The second interconnect structure 126' provides electrical connections in a horizontal direction for a plurality of packaged semiconductor devices 140 in some embodiments, for example. The second interconnect structure 126' comprises back-side routing, and the first interconnect structure 126 comprises front-side routing, e.g., relative to the integrated circuit die 101, for the packaged semiconductor devices 140 in some embodiments.

Only one packaged semiconductor device 140 is shown disposed over the second carrier 103*b* in FIG. 12; however, dozens, hundreds, or more packaged semiconductor devices 140 may be simultaneously formed over the first carrier 103*a* and/or second carrier 103*b* in an array of rows and columns. Each of the packaged semiconductor devices 140 comprises an integrated circuit die 101 or a plurality of integrated circuit dies 101. For example, two or more integrated circuit dies 101 may be packaged together in a single packaged semiconductor device 140.

In some embodiments, the plurality of connectors 136 or 136' is not included on the packaged semiconductor device 140. In other embodiments, only a first interconnect structure 126 or a second interconnect structure 126' that includes the shadow pad material 134/134" or 134', respectively, is included on the packaged semiconductor device 140.

The method of packaging semiconductor devices using the carriers 103*a* and/or 103*b* is merely an example: the integrated circuit dies 101 may be packaged using different methods or orders of a packaging process. For example, only the first carrier 103*a* shown in FIG. 3 in phantom may be used, and the second interconnect structure 126' may be formed on the first carrier 103*a*. The through-vias 142 may be formed over the second interconnect structure 126', the integrated circuit dies 101 may be attached to the second interconnect structure 126', and the molding material 144 may then be applied. The molding material 144 is planarized, the first carrier 103*a* is then removed, and the connectors 136' and molding material 138' may be formed over the second interconnect structure 126'.

The packaged semiconductor devices 140 comprise fan-out structures in some embodiments. For example, the conductive wiring is spaced apart farther in the first and second interconnect structures 126 and 126' than conductive wiring of the integrated circuit die 101 is spaced. Likewise, the footprint of contact pads in or on the first and second interconnect structures 126 and 126' is larger than the footprint of contact pads 110 and/or 116 of the integrated circuit die 101.

Figure 13:
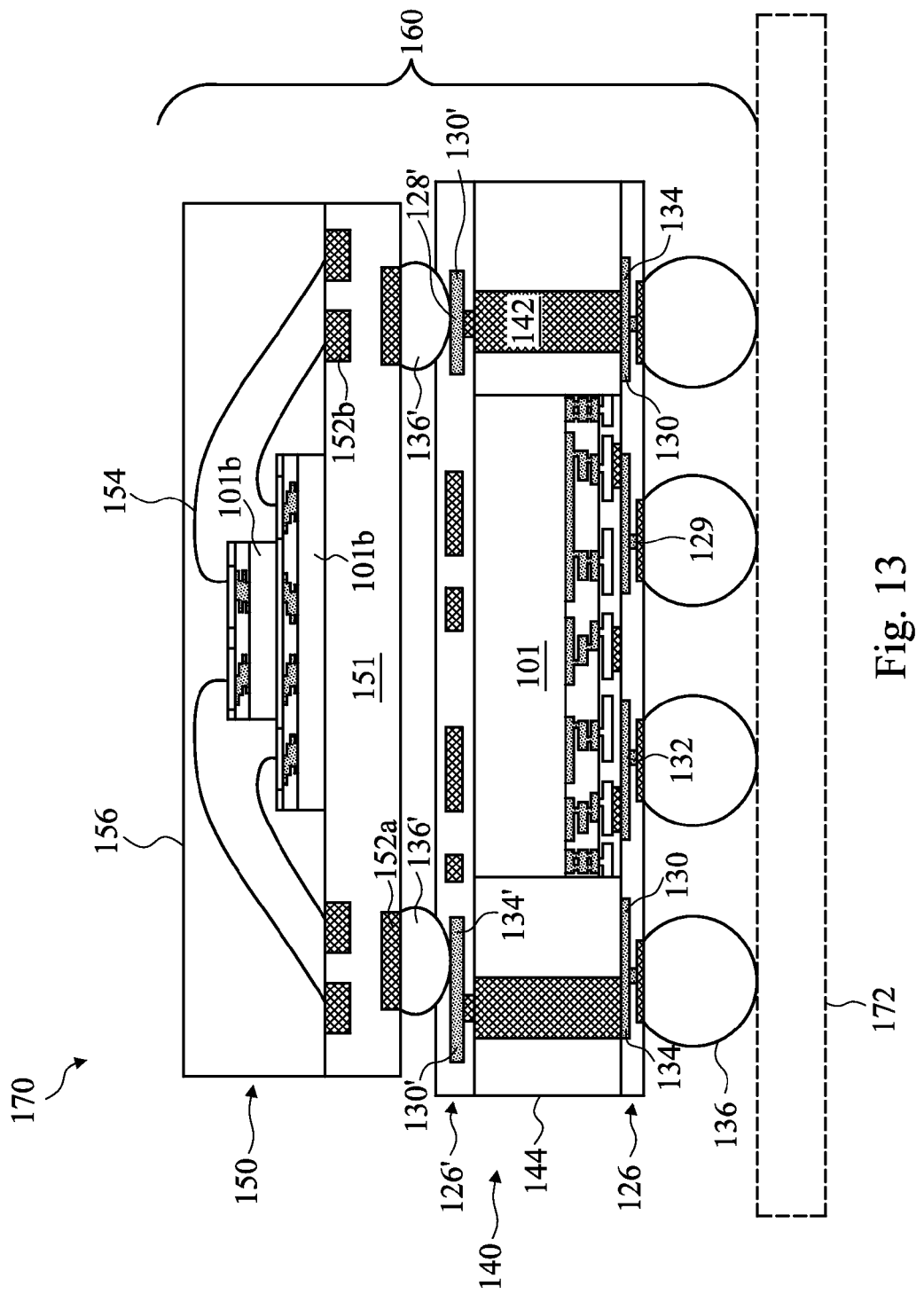
FIG. 13 is a cross-sectional view of a package-on-package (POP) device in accordance with some embodiments, wherein a packaged semiconductor device of the POP device includes the shadow pad material.

FIG. 13 is a cross-sectional view of a package-on-package (POP) device 170 in accordance with some embodiments. A packaged integrated circuit may be coupled to the first interconnect structure 126 or the second interconnect structure 126' of a packaged semiconductor device 140 to form a POP device 170, for example. In FIG. 13, the packaged semiconductor devices 140 comprise first packaged semiconductor devices 140 that each include an integrated circuit die 101. Each first packaged semiconductor device 140 is packaged with a second packaged semiconductor device 150 to form a POP device 170. The second packaged semiconductor devices 150 are also referred to herein as packaged integrated circuits (ICs), for example.

Before the packaged semiconductor devices 140 are singulated, and after the second interconnect structure 126' is formed, a plurality of the second packaged semiconductor devices 150 is provided, and each of the plurality of second packaged semiconductor devices 150 is coupled to one of the first packaged semiconductor devices 140 using connectors 136' coupled to the second interconnect structure 136' of the first packaged semiconductor devices 140, coupled to the second packaged semiconductor devices 150, or coupled to both the first packaged semiconductor devices 140 and the second packaged semiconductor devices 150. The plurality of second packaged semiconductor devices 150 is coupled to the unsingulated plurality of first packaged semiconductor devices 140 by a method such as manually by an operator or technician, the use of an automated machine such as a pick-and-place machine, or other methods. The plurality of first packaged semiconductor devices 140 is then singulated to form the POP devices 170.

Each of the plurality of second packaged semiconductor devices 150 may comprise a substrate 151 that includes a plurality of contact pads 152a and 152b disposed on. The substrate 151 may include one or more interconnect structures (not shown) formed thereon that provide horizontal connections for the plurality of second packaged semiconductor devices 150 in some embodiments. The substrate 151 may also include a plurality of through-vias (also not shown) formed therein. One or more integrated circuit dies 101b may be coupled to a top surface of the substrate 151. Each of the plurality of second packaged semiconductor devices 150 comprises two vertically stacked integrated circuit dies 101b in the embodiments shown in FIG. 13, for example. Two or more integrated circuit dies 101b may also be packaged together horizontally in the second packaged semiconductor devices 150 in some embodiments, not shown.

In the embodiments shown, the integrated circuit dies 101b are coupled to contact pads 152b disposed on a top surface of the substrate 151 by bond wires 154. The bond wires 154 and through-vias in the substrate 151 provide vertical electrical connections for the plurality of second packaged semiconductor devices 150 in some embodiments. A molding material 156 is disposed over the integrated circuit dies 101b, the bond wires 154, and the substrate 151. The molding material 156 may comprise similar materials as described for the molding materials 138 or 144 of the plurality of first packaged semiconductor devices 140, for example.

In some embodiments, the integrated circuit die or dies 101b comprise DRAM devices, for example. The integrated circuit dies 101b may also comprise other types of devices.

One or more integrated circuit dies 101b may be included in the second packaged semiconductor devices 150. The integrated circuit dies 101b may be packaged together vertically as shown, or horizontally. The integrated circuit dies 101b may be packaged in a wire bond type of package as shown in FIG. 13, or the integrated circuit dies 101b may be packaged in other types of packages and using other types of packaging techniques.

A plurality of connectors 136', such as a eutectic material, is coupled to the bottom surface of the substrates 151 of the second packaged semiconductor devices 150 in some embodiments. The plurality of connectors 136' may be coupled to contact pads 152a disposed on a bottom surface of the substrate 151, for example. In some embodiments, the plurality of second packaged semiconductor devices 150 does not include the plurality of connectors 136', e.g., in embodiments wherein the plurality of first packaged semiconductor devices 140 includes the plurality of connectors 136' disposed on the top surface thereof. In other embodiments, a plurality of connectors 136' are included on both the first packaged semiconductor devices 140 and the second packaged semiconductor devices 150.

After the second packaged semiconductor devices 150 are coupled to the first packaged semiconductor devices 140 using the plurality of connectors 136', as shown in FIG. 13, a eutectic material of the connectors 136' is then reflowed, which mechanically and electrically couples the second packaged semiconductor devices 150 to the first packaged semiconductor devices 140. Each of the plurality of second packaged semiconductor devices 150 is coupled to one of the plurality of first packaged semiconductor devices 140 using some of the plurality of connectors 136', for example. The plurality of first packaged semiconductor devices 140 and the plurality of second packaged semiconductor devices 150 are arranged in an array of rows and columns in some embodiments. A plurality of scribe lines is disposed in an x direction and y direction between the plurality of first packaged semiconductor devices 140 and the plurality of second packaged semiconductor devices 150 in some embodiments. The POP devices 170 are then singulated along the scribe lines.

The POP devices 170 may then be coupled to another device or object using the plurality of connectors 136 disposed on the bottom surfaces of the POP devices 170, e.g., using a surface mount technology (SMT) process. In some embodiments, the POP devices 170 may be coupled to a substrate 172, shown in phantom in FIG. 13, to form a chip-on-wafer-on-substrate (CoWoS) device. The POP devices 170 include the packaged semiconductor devices 140 that include the shadow pad material proximate landing pads and PPI pads described herein.

Figure 14:
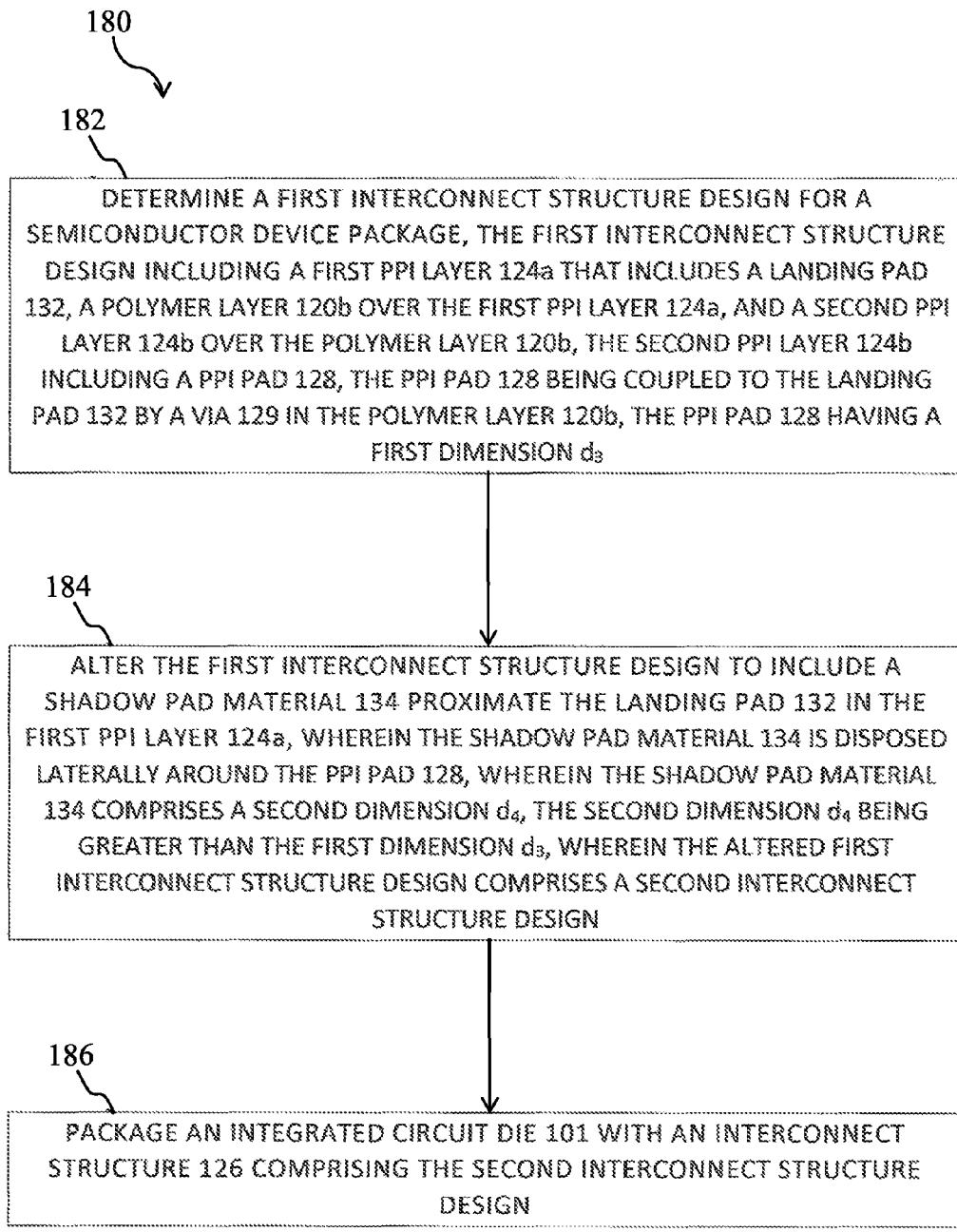
FIG. 14 is a flow chart of a method of packaging a semiconductor device in accordance with some embodiments of the present disclosure.

FIG. 14 is a flow chart 180 of a method of packaging a semiconductor device in accordance with some embodiments of the present disclosure. In step 182, (see also FIGS. 1 and 2) a first interconnect structure design for a semiconductor device package is determined, the first interconnect structure design including a first PPI layer 124a that includes a landing pad 132, a polymer layer 120b over the first PPI layer 124a, and a second PPI layer 124b over the polymer layer 120b, the second PPI layer 124b including a PPI pad 128, the PPI pad 128 being coupled to the landing pad 132 by a via 129 in the polymer layer 120b. The PPI pad 128 has a first dimension $d_3$ (see also FIG. 3). In step 184, the first interconnect structure design is altered to include a shadow pad material 134 proximate the landing pad 132 in the first PPI layer 124a, wherein the shadow pad material 134 is disposed laterally around the PPI pad 128, wherein the shadow pad material 134 comprises a second dimension $d_4$, the second dimension $d_4$ being greater than the first dimension $d_3$, which is also illustrated in FIG. 3. The altered first interconnect structure design comprises a second interconnect structure design. In step 186, an integrated circuit die 101 is packaged with an interconnect structure 126 comprising the second interconnect structure design, also shown in FIG. 4.

Figure 15:
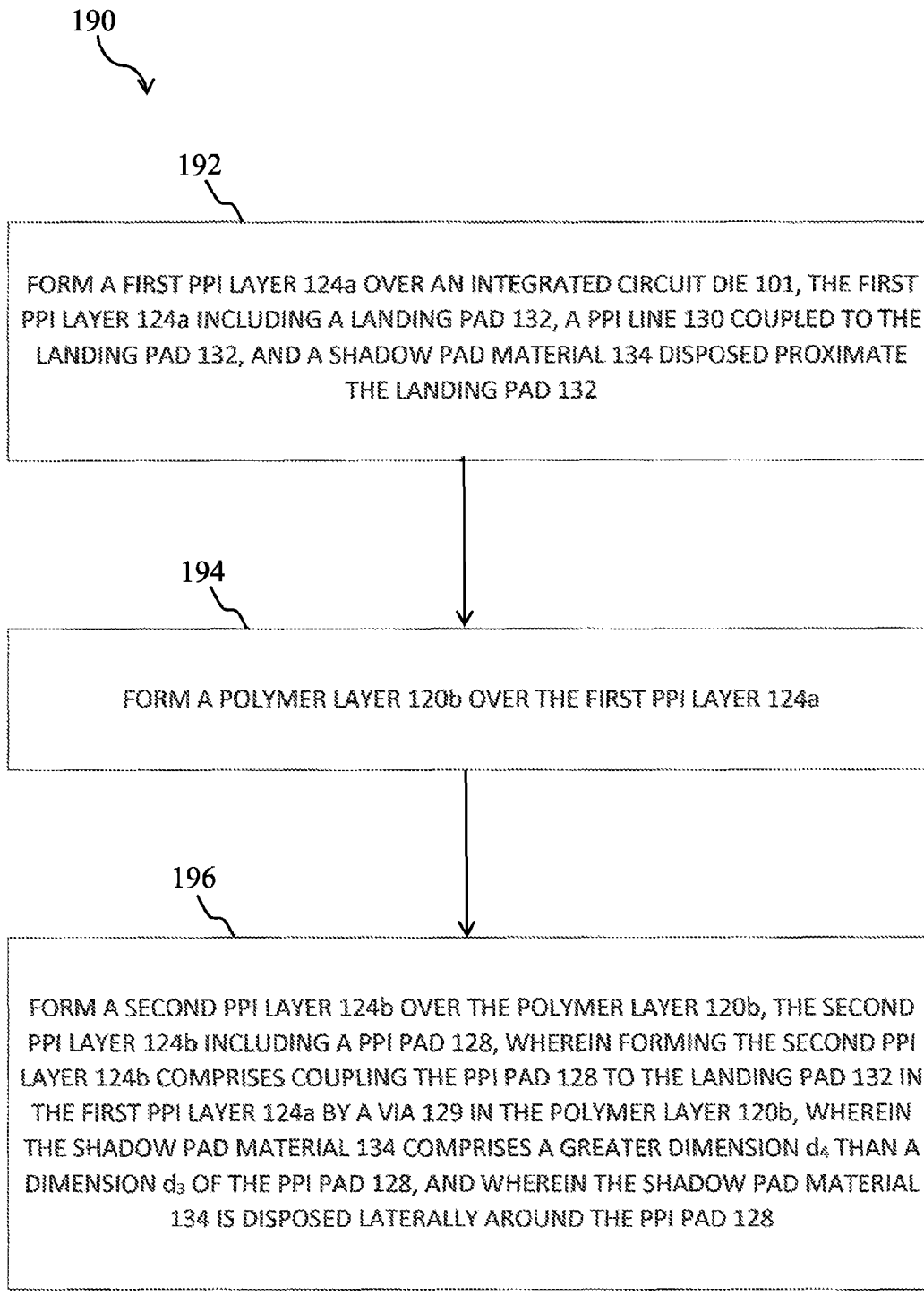
FIG. 15 is a flow chart of a method of packaging a semiconductor device in accordance with some embodiments.

FIG. 15 is a flow chart 190 of a method of packaging a semiconductor device in accordance with other embodiments of the present disclosure. In step 192, a first PPI layer 124a is formed over an integrated circuit die 101, the first PPI layer 124a including a landing pad 132, a PPI line 130 coupled to the landing pad 132, and a shadow pad material 134 disposed proximate the landing pad 132, also shown in FIG. 3. In step 194, a polymer layer 120b is formed over the first PPI layer 124a. In step 196, a second PPI layer 124b is formed over the polymer layer 120b, the second PPI layer 124b including a PPI pad 128. Forming the second PPI layer 124b comprises coupling the PPI pad 128 to the landing pad 132 in the first PPI layer 124a by a via 129 in the polymer layer 120b. The shadow pad material 134 comprises a greater dimension $d_4$ than a dimension $d_3$ of the PPI pad 128, also shown in FIGS. 3 and 4. The shadow pad material 134 is disposed laterally around the PPI pad 128.

Some embodiments of the present disclosure are advantageously implementable in and are particularly beneficial when used in POP devices, in some applications. The packaged semiconductor devices may comprise POP devices 170, system-on-a chip (SOC) devices, chip-on-wafer-on-substrate (CoWoS) devices, or other types of 3DICs in some embodiments, as examples. Embodiments of the present disclosure are also beneficial for and may be implemented in other types of devices or wafer level packaging that include interconnect structures and fan-out structures, as other examples.

In some embodiments, the integrated circuit dies 101 comprise first integrated circuit dies 101a that comprise logic devices or processors and the first packaged semiconductor devices 140 comprise fan-out wiring, and the second integrated circuit dies 101b comprise memory devices such as DRAM devices, e.g., in some embodiments wherein the shadow pad material 134, 134', and 134" described herein is implemented in an integration fan-out (InFO) POP device 170. In some embodiments, the second packaged semiconductor devices 150 include a plurality of stacked integrated circuit dies 101b comprising DRAM devices, for example. The first integrated circuit dies 101a, the second integrated circuit dies 101b, the first packaged semiconductor devices 140, and the second packaged semiconductor devices 150 may also comprise other types of devices, and the shadow pad materials 134, 134", or 134' and processes described herein may be implemented in other types of applications.

Some embodiments of the present disclosure include packaged semiconductor devices 140 and POP devices 170 that include the shadow pad material 134 or 134" proximate the PPI pads 128. Some embodiments include interconnect structures 126 and packaged semiconductor devices 140 that include the shadow pad material 134 or 134" proximate the PPI pads 128. Other embodiments include methods of packaging semiconductor devices.

Advantages of some embodiments of the present disclosure may include providing packaging methods and structures for wafer-level packages (WLPs), POP devices, other types of 3DICs, and other types of packages that include the shadow pad material described herein proximate the PPI pads and landing pads. The shadow pad material may lower stress of the interconnect structure, improve signal design flexibility, and improve CPI windows. Signal integrity may be improved, and less routing space or area may be required in some embodiments, which may result in reduced costs. Reliability and performance of packaged semiconductor devices may be improved by reducing stress within the interconnect structure of the packages in some embodiments, for example. The shadow pad material is formed in the same material layer as PPI lines and landing pads; thus, some embodiments are implementable without requiring additional processing steps or costs. The shadow pad material may be implemented in UFI interconnect structures, which advantageously do not require UBM structures, which provides a time and cost savings. Furthermore, the packaging methods and structures described herein are easily implementable into existing packaging process flows and structures.

In some embodiments, an interconnect structure includes a first PPI layer comprising a landing pad and a shadow pad material disposed proximate the landing pad, and a polymer layer disposed over the first PPI layer. A second PPI layer is disposed over the polymer layer, the second PPI layer comprising a PPI pad. The PPI pad is coupled to the landing pad by a via in the polymer layer. The shadow pad material is disposed proximate the PPI pad and comprises a greater dimension than a dimension of the PPI pad. The shadow pad material is disposed laterally around the PPI pad.

In other embodiments, a packaged semiconductor device includes an integrated circuit die, and a first PPI layer disposed over the integrated circuit die. The first PPI layer includes a landing pad, a PPI line coupled to the landing pad, and a shadow pad material disposed proximate the landing pad. A polymer layer is disposed over the first PPI layer. A second PPI layer is disposed over the polymer layer. The second PPI layer includes a PPI pad, wherein the PPI pad is coupled to the landing pad by a via in the polymer layer. The shadow pad material is disposed proximate the PPI pad and comprises a greater dimension than a dimension of the PPI pad. The shadow pad material is disposed laterally around the PPI pad and extends laterally beyond lateral boundaries of the PPI pad.

In yet other embodiments, a method of packaging a semiconductor device includes forming a first PPI layer over an integrated circuit die, the first PPI layer comprising a landing pad, a PPI line coupled to the landing pad, and a shadow pad material disposed proximate the landing pad. The method includes forming a polymer layer over the first PPI layer, and forming a second PPI layer over the polymer layer, the second PPI layer comprising a PPI pad. Forming the second PPI layer comprises coupling the PPI pad to the landing pad in the first PPI layer by a via in the polymer layer. The shadow pad material comprises a greater dimension than a dimension of the PPI pad. The shadow pad material is disposed laterally around the PPI pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
a first post-passivation interconnect (PPI) layer comprising a landing pad and a shadow pad material disposed proximate the landing pad;
a polymer layer disposed over the first PPI layer; and
a second PPI layer disposed over the polymer layer, the second PPI layer comprising a PPI pad, wherein the PPI pad is electrically coupled to the landing pad by a via in the polymer layer, wherein the shadow pad material is disposed proximate the PPI pad and comprises a greater dimension than a dimension of the PPI pad, wherein the shadow pad material is disposed laterally around the PPI pad overlapping an edge of the PPI pad in a plan view, and wherein the shadow pad material is not electrically coupled to the landing pad.

2. The interconnect structure according to claim 1, wherein the landing pad is electrically coupled to a PPI line, and wherein the shadow pad material is disposed proximate a portion of the PPI line.

3. The interconnect structure according to claim 2, wherein the PPI line comprises a first PPI line, and wherein the first PPI layer further comprises a second PPI line proximate the landing pad, the first PPI line, or the shadow pad material.

4. The interconnect structure according to claim 1, wherein the shadow pad material comprises an enlarged portion of a PPI line.

5. The interconnect structure according to claim 1, wherein a portion of the shadow pad material comprises a dummy conductive material disposed proximate the landing pad, and wherein the dummy conductive material is not electrically coupled to a conductive element of the interconnect structure.

6. The interconnect structure according to claim 1, wherein the first PPI layer further comprises a first PPI line, wherein the first PPI line is electrically coupled to the landing pad, wherein the first PPI line is not electrically coupled to the shadow pad material, and wherein the first PPI line separates the shadow pad material into two portions.

7. The interconnect structure according to claim 6, wherein the first PPI layer further comprises a second PPI line, wherein the second PPI line is not electrically coupled to the shadow pad material, the first PPI line, and the landing pad, and wherein a portion of the second PPI line extends under the PPI pad in the plan view.

8. A packaged semiconductor device, comprising:
an integrated circuit die;
a first post-passivation interconnect (PPI) layer disposed over the integrated circuit die, the first PPI layer comprising a landing pad, a PPI line electrically coupled to the landing pad, and a first shadow pad material disposed proximate the landing pad;
a second shadow pad material disposed proximate the landing pad, the second shadow pad material not being electrically coupled to the landing pad;
a polymer layer disposed over the first PPI layer; and
a second PPI layer disposed over the polymer layer, the second PPI layer comprising a PPI pad,
wherein the PPI pad is electrically coupled to the landing pad by a via in the polymer layer, wherein the first shadow pad material and second shadow pad material are disposed proximate the PPI pad, wherein the first shadow pad material comprises a greater dimension than a dimension of the PPI pad, and wherein the first shadow pad material and second shadow pad material are disposed laterally around portions of the PPI pad and extend, in a plan view, from beneath the PPI pad laterally beyond lateral boundaries of the PPI pad.

9. The packaged semiconductor device according to claim 8, wherein the dimension of the first shadow pad material comprises a diameter or width of the first shadow pad material, wherein the dimension of the PPI pad comprises a diameter or width of the PPI pad, and wherein the diameter or width of the first shadow pad material is greater than the diameter or width of the PPI pad by about 5 μm to about 20 μm on a side of the PPI pad.

10. The packaged semiconductor device according to claim 8, wherein the first shadow pad material substantially comprises a shape in a top view of the packaged semiconductor device selected from the group consisting essentially of: a portion of a circle, a portion of an annulus, a portion of a square, a portion of a polygon, a mesh, a portion of a mesh, a plurality of circles, a plurality of squares, a plurality of polygons, and combinations thereof.

11. The packaged semiconductor device according to claim 8, wherein a material disposed beneath the PPI pad substantially comprises a shape of an enlarged shadow of the PPI pad, and wherein the material includes the landing pad, a portion of the PPI line, and the first shadow pad material.

12. The packaged semiconductor device according to claim 8, wherein the integrated circuit die comprises a first side and a second side opposite the first side, wherein the first PPI layer, the polymer layer, and the second PPI layer comprise a first interconnect structure disposed proximate the first side of the integrated circuit die, and wherein the packaged semiconductor device includes a second interconnect structure disposed proximate the second side of the integrated circuit die.

13. The packaged semiconductor device according to claim 12, further comprising a packaged integrated circuit coupled to the first interconnect structure or the second interconnect structure.

14. The packaged semiconductor device according to claim 13, wherein the packaged semiconductor device comprises a fan-out structure, and wherein the packaged integrated circuit comprises a dynamic random access memory (DRAM) device disposed over a substrate and a molding material disposed over the DRAM device and the substrate.

15. A structure, comprising:
a contact pad on a substrate;
a first post-passivation interconnect (PPI) in a first PPI layer over the substrate, the PPI comprising:
a first PPI line electrically coupled to the contact pad and running in a first dimension away from the contact pad,
a landing pad electrically coupled to the first PPI line, the landing pad greater in a second dimension than the first PPI line,
a second PPI line proximate the landing pad and collinear with the first PPI line, the second PPI line not being electrically coupled to the landing pad,
a shadow pad material disposed proximate the landing pad, the shadow pad material not being electrically coupled to the first PPI line; and
a polymer layer disposed over the first PPI layer, the polymer layer having a via to the landing pad of the first PPI layer; and
a second PPI layer disposed over the polymer layer, the second PPI layer comprising a PPI pad, wherein the PPI pad is electrically coupled to the landing pad by the via in the polymer layer, wherein the shadow pad material extends in a plan view from under the PPI pad laterally further from the via than the PPI pad.

16. The structure of claim 15, wherein the shadow pad material is electrically coupled to the second PPI line.

17. The structure of claim 15, wherein the shadow pad material is not electrically coupled to the second PPI line.

18. The structure of claim 15, further comprising a third PPI line running in the first PPI layer, wherein the shadow pad material is electrically coupled to the third PPI line.

19. The structure of claim 18, wherein the third PPI line is electrically coupled to a signal line, a ground line, or a power line.

20. The structure of claim 15, further comprising a third PPI line running in the first PPI layer proximate the via, wherein the third PPI line is not electrically coupled to the shadow pad material and is not electrically coupled to the first PPI line.

* * * * *